US006777681B1

(12) United States Patent
Schimert et al.

(10) Patent No.: US 6,777,681 B1
(45) Date of Patent: Aug. 17, 2004

(54) INFRARED DETECTOR WITH AMORPHOUS SILICON DETECTOR ELEMENTS, AND A METHOD OF MAKING IT

(75) Inventors: Thomas R. Schimert, Ovilla, TX (US); Howard R. Beratan, Richardson, TX (US); Charles M. Hanson, Dallas, TX (US); Kevin L. Soch, Nevada City, CA (US); John H. Tregilgas, Richardson, TX (US)

(73) Assignee: Raytheon Company, Waltham, MA (US)

( * ) Notice: Subject to any disclaimer, the term of this patent is extended or adjusted under 35 U.S.C. 154(b) by 1 day.

(21) Appl. No.: 09/844,171

(22) Filed: Apr. 25, 2001

(51) Int. Cl.[7] ................................................. G01J 5/02
(52) U.S. Cl. .................... 250/338.4; 250/330; 250/332; 250/338.1
(58) Field of Search ................................. 250/330, 332, 250/338.1, 338.3, 338.4

(56) References Cited

U.S. PATENT DOCUMENTS

| 4,169,273 | A | 9/1979 | Hendrickson |
| 4,291,815 | A | 9/1981 | Gordon et al. |
| 4,352,449 | A | 10/1982 | Hall et al. |
| 4,654,622 | A | 3/1987 | Foss et al. |
| 4,701,424 | A | 10/1987 | Mikkor |
| 4,752,694 | A | 6/1988 | Hegel, Jr. et al. |
| 5,010,251 | A | 4/1991 | Grinberg et al. |
| 5,021,663 | A | 6/1991 | Hornbeck |
| 5,082,162 | A | 1/1992 | Kamiyama et al. |
| 5,196,377 | A | 3/1993 | Wagner et al. |
| 5,220,188 | A | 6/1993 | Higashi et al. |
| 5,260,225 | A | 11/1993 | Liu et al. |
| 5,286,671 | A | 2/1994 | Kurtz et al. |
| 5,286,976 | A | 2/1994 | Cole |
| 5,288,649 | A | 2/1994 | Keenan |
| 5,300,915 | A | 4/1994 | Higashi et al. |

(List continued on next page.)

FOREIGN PATENT DOCUMENTS

| EP | 0 828 346 A2 | 3/1998 |
| EP | 0 951 069 A1 | 10/1999 |
| EP | 0971219 A1 | 1/2000 |
| EP | 0977275 A1 | 2/2000 |
| EP | 1072875 A1 | 1/2001 |
| FR | 2 780 200 | 12/1999 |
| WO | WO 99/50905 | 10/1999 |

OTHER PUBLICATIONS

Tissot, et al., "LETI/LIR's Amorphous Silicon Uncooled Microbolometer Development", SPIE vol. 3379, Part of the SPIE Conference on Infrared Detectors and Focal Plane Arrays V, Orlando, Florida, Apr. 1998, pp. 139–144.

U.S. Ser. No. 09/557,748, "Microbolometer and Method for Forming", filed Apr. 25, 2000, inventors: Thomas R. Schimert, Roland W. Gooch, William McCardel and Bobbi A. Ritchey (Attorney Docket Nos. 004578. PD99E943).

*Primary Examiner*—Constantine Hannaher
*Assistant Examiner*—Timothy J. Moran
(74) *Attorney, Agent, or Firm*—Baker Botts L.L.P.

(57) ABSTRACT

An infrared detector (10) includes a substrate (16) having thereon an array of detector elements (21, 139). Each detector element has a membrane (41, 81, 91, 111, 141), which includes an amorphous silicon layer (51, 142) in contact with at least two electrodes (53, 56–57, 92, 112–113, 143–145) that are made of a titanium/aluminum alloy which absorbs infrared radiation. In order to obtain a desired temperature coefficient of resistance (TCR), the amorphous silicon layer may optionally be doped. The effective resistance between the electrodes is set to a desired value by appropriate configuration of the electrodes and the amorphous silicon layer. The membrane includes two outer layers (61–62, 146–147) made of an insulating material. Openings (149) may optionally be provided through the membrane.

38 Claims, 7 Drawing Sheets

U.S. PATENT DOCUMENTS

| | | |
|---|---|---|
| 5,367,167 A | 11/1994 | Keenan |
| 5,367,194 A | 11/1994 | Beatty |
| 5,431,328 A | 7/1995 | Chang et al. |
| 5,449,910 A | 9/1995 | Wood et al. |
| 5,450,053 A | 9/1995 | Wood |
| 5,455,421 A | 10/1995 | Spears |
| 5,512,748 A | 4/1996 | Hanson |
| 5,534,111 A | 7/1996 | Hocker et al. |
| 5,539,206 A | 7/1996 | Schimert |
| 5,573,859 A | 11/1996 | Suppelsa |
| 5,589,688 A * | 12/1996 | Kimura et al. ........... 250/338.4 |
| 5,605,489 A | 2/1997 | Gale et al. |
| 5,659,195 A | 8/1997 | Kaiser et al. |
| 5,701,008 A | 12/1997 | Ray et al. |
| 5,726,480 A | 3/1998 | Pister |
| 5,760,398 A | 6/1998 | Blackwell et al. |
| 5,773,987 A | 6/1998 | Montoya |
| 5,777,328 A | 7/1998 | Gooch |
| 5,789,753 A | 8/1998 | Gooch et al. |
| 5,825,029 A * | 10/1998 | Agnese et al. ........... 250/338.1 |
| 5,895,233 A | 4/1999 | Higashi et al. |
| 5,905,007 A | 5/1999 | Ho et al. |
| 5,912,464 A * | 6/1999 | Vilain et al. ............. 250/338.4 |
| 5,915,168 A | 6/1999 | Salatino et al. |
| 5,919,548 A | 7/1999 | Barron et al. |
| 5,921,461 A | 7/1999 | Kennedy et al. |
| 5,923,995 A | 7/1999 | Kao et al. |
| 5,929,441 A | 7/1999 | Beratan et al. |
| 5,945,673 A | 8/1999 | Beratan et al. |
| 5,970,315 A | 10/1999 | Carley et al. |
| 6,028,312 A | 2/2000 | Wadsworth et al. |
| 6,036,872 A | 3/2000 | Wood et al. |
| 6,046,067 A | 4/2000 | Werner |
| 6,054,745 A | 4/2000 | Nakos et al. |
| 6,062,461 A | 5/2000 | Sparks et al. |
| 6,064,216 A | 5/2000 | Farnworth et al. |
| 6,087,199 A | 7/2000 | Pogge et al. |
| 6,100,525 A | 8/2000 | Eden |
| 6,111,254 A | 8/2000 | Eden |
| 6,114,696 A | 9/2000 | Eden |
| 6,114,697 A | 9/2000 | Eden et al. |
| 6,119,920 A | 9/2000 | Guthrie et al. |
| 6,133,570 A | 10/2000 | Schimert et al. |
| 6,143,997 A | 11/2000 | Feng et al. |
| 6,159,812 A | 12/2000 | Cheek et al. |
| 6,210,988 B1 | 4/2001 | Howe et al. |
| 6,232,150 B1 | 5/2001 | Lin et al. |
| 6,316,770 B1 | 11/2001 | Ouvrier-Buffet et al. |
| 6,320,189 B1 | 11/2001 | Ouvrier-Buffet et al. |
| 6,392,232 B1 | 5/2002 | Gooch et al. |

\* cited by examiner

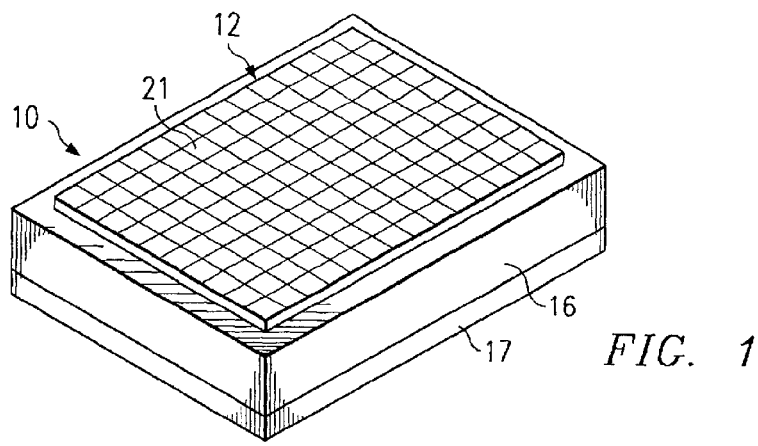
FIG. 1
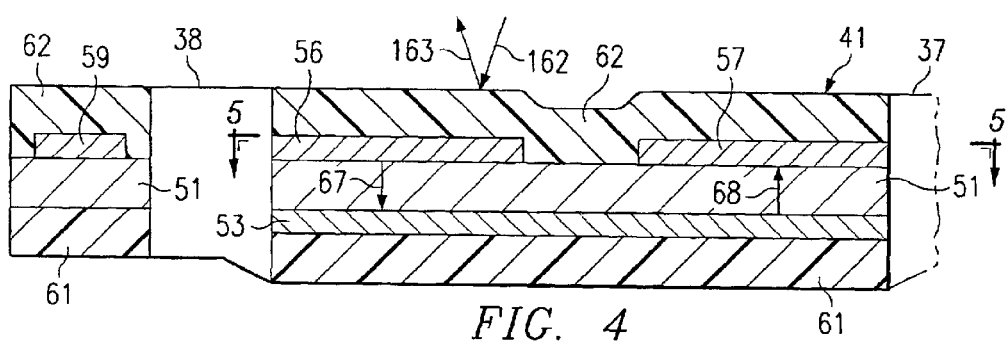
FIG. 4
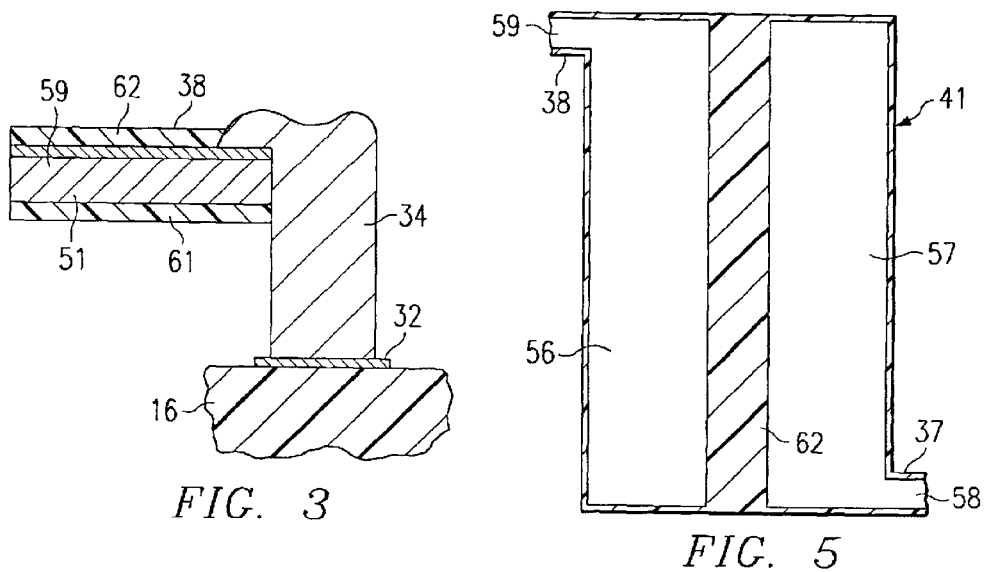
FIG. 3
FIG. 5

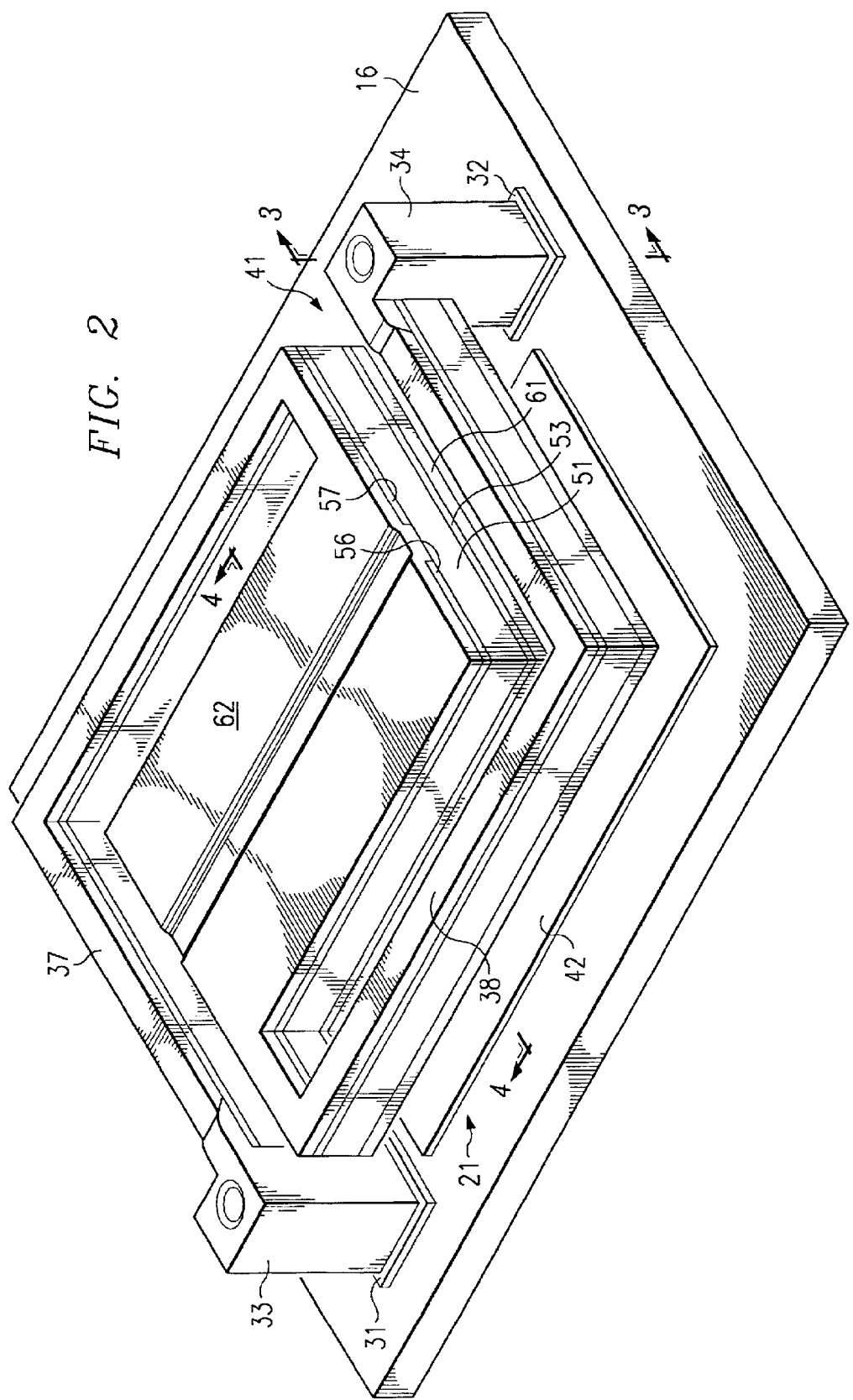

INFRARED DETECTOR WITH AMORPHOUS SILICON DETECTOR ELEMENTS, AND A METHOD OF MAKING IT

TECHNICAL FIELD OF THE INVENTION

This invention relates in general to infrared detectors and, more particularly, to infrared detectors in which the thermally sensitive material is amorphous silicon.

BACKGROUND OF THE INVENTION

Over the years, various types of infrared detectors have been developed. Many include a substrate having thereon a focal plane array, the focal plane array including a plurality of detector elements that each correspond to a respective pixel. The substrate contains an integrated circuit which is electrically coupled to the detector elements, and which is commonly known as a read out integrated circuit (ROIC).

Each detector element includes a membrane which is suspended at a location spaced above the top surface of the substrate, in order to facilitate thermal isolation. The membrane includes a thermally sensitive material, such as vanadium oxide (VOx). The membrane also includes two electrodes, which are each coupled to the thermally sensitive material, and which are also coupled to the ROIC in the substrate. As the temperature of the thermally sensitive material varies, the resistance of the thermally sensitive material also varies, and the ROIC in the substrate can determine the amount of thermal energy which has been received at a detector element by sensing the resistance of that detector element. Existing ROIC circuits have been developed to be compatible with input impedance requirements of the associated detector elements.

One common type of ROIC circuit is known as a pulse-biased mode current skimming ROIC, and is frequently used with vanadium oxide detector elements. In this type of ROIC, the bias voltage to the electrodes in each membrane is not continuous. Instead, the bias voltage is kept off until the ROIC is ready to read the detector element. The bias voltage is then turned on, the current which then flows through the thermally sensitive material in the detector element is integrated, the result of the integration is read, and the bias voltage is turned off. This type of pulsed-mode operation limits heating within the detector element caused by the current flow from the bias voltage. The input impedance of this type of ROIC is typically in the range of about 10 KΩ to 1000 KΩ. A different type of known ROIC circuit is a direct current bias switched capacitor integrating amplifier per unit cell ROIC. In this approach, the bias voltage to each detector element is kept on continuously, and the output of the detector element is periodically switched to an integrating amplifier. The input impedance of this type of ROIC is typically in the range of about 10 MΩ to 100 MΩ.

Although infrared detector devices of this known type have been generally adequate for their intended purposes, they have not been satisfactory in all respects. For example, some disadvantages include limitations relating to the thermal mass in the membrane, the difficulty in balancing stress between layers in the membrane, high noise levels, and a relatively low temperature coefficient of resistance (TCR), where TCR is a relatively standard measure of sensitivity for purposes of measuring thermal radiation.

An approach to resolving some of the existing problems has been based on the use of amorphous silicon as the thermally sensitive material. Amorphous silicon has the advantage that a relatively high TCR value and thus a high level of sensitivity can be obtained by providing a low level of doping, or even by leaving the amorphous silicon undoped. However, when amorphous silicon is undoped or has a low level of doping, it also has a very high resistance. As a result, problems have been encountered in attempting to use amorphous silicon to implement detector elements which have a high TCR and thus a high level of sensitivity, but which also have an impedance that is matched to the input impedance requirements of existing ROIC designs. This is because the effective resistance of the detector element was linked to the doping level that also provided the high level of sensitivity. For a desirably high level of sensitivity, the resistivity of an amorphous silicon detector tended to be about three orders of magnitude higher than would be appropriate for impedance matching with a pre-existing ROIC. Finally, prior to the present invention, it was impractical to use a relatively low doped amorphous silicon detector element with a pre-existing ROIC circuit designed for a lower impedance detector element (1 KΩ to 1000 KΩ), such as a pulsed-bias mode ROIC, because the impedance requirements could not be matched in a suitable manner.

A related consideration is that there are applications in which it is desirable to operate an infrared detector at a higher frame rate than the standard video frame rate of 30 frames per second. But where the detector elements have a high resistance, it is difficult to operate them at a high rate of speed because a very high current would be required to read information rapidly out of a detector element with a high resistance, and the requisite high current would present problems in terms of power consumption, damage to the integrated circuit device, and so forth.

One preexisting detector element based on amorphous silicon has a membrane which is about 2300 Å thick. The membrane contains an amorphous silicon layer, and has two spaced electrodes which each contact the amorphous silicon layer adjacent a respective end thereof. The amorphous silicon layer and the electrodes are sandwiched between two insulating layers. One of the insulating layers has embedded therein a relatively large absorber layer made from a material which absorbs infrared radiation. The electrodes are provided outwardly from the absorber layer on opposite sides thereof. Consequently, there is a relatively significant spacing between the electrodes. This distance between the electrodes is needed for optimum operation of the absorber layer. However, it also means that, when the amorphous silicon layer is undoped or lightly doped in order to obtain a high TCR, the effective resistance created between the electrodes by the amorphous silicon layer is so high that the impedance of the detector element can not realistically be matched to the impedance requirements of existing ROIC designs. While it would theoretically be possible to change existing ROIC designs in order to obtain an ROIC with an input impedance matched to the impedance of the detector elements, there is a strong incentive to avoid the expense and problems involved is with attempting to change an existing ROIC design.

SUMMARY OF THE INVENTION

From the foregoing, it may be appreciated that a need has arisen for an infrared detector, and a method of making it, where the infrared detector provides a high level of sensitivity while reducing problems of the type discussed above, in a manner so that an effective resistance for a detector element is substantially independent of the temperature coefficient of resistance and the level of doping. According to a first form of the present invention, a method and apparatus are provided to address this need, and involve the provision of an amorphous silicon portion which has a selected temperature coefficient of resistance, and the fabrication of first and second electrodes which are at spaced locations on the amorphous silicon portion and which are electrically coupled to the amorphous silicon portion. The electrodes and the amorphous silicon portion are structurally configured so as to provide between the electrodes through the amorphous silicon portion at a given temperature a resistance selected independently of the temperature coefficient of resistance.

It will also be recognized that a need has arisen for an infrared detector, and a method of making it, in which the infrared radiation is efficiently absorbed. According to further form of the present invention, a method and apparatus are provided to meet this need, and involve: providing a thermally sensitive portion having a resistance which varies with temperature; and fabricating a thermal absorber portion which absorbs infrared radiation, which is in thermal communication with the thermally sensitive portion, and which is made of an alloy that includes titanium and aluminum.

BRIEF DESCRIPTION OF THE DRAWINGS

A better understanding of the present invention will be realized from the detailed description which follows, taken in conjunction with the accompanying drawings, in which:

FIG. 1 is a diagrammatic perspective view of an infrared detector which embodies the present invention;

FIG. 2 is a diagrammatic fragmentary perspective view of a detector element which is a component of the infrared detector of FIG. 1;

FIG. 3 is a diagrammatic sectional view taken along the ling 3—3 in FIG. 2;

FIG. 4 is a diagrammatic sectional view taken along the line 4—4 in FIG. 2;

FIG. 5 is a diagrammatic sectional view taken along the line 5—5 in FIG. 4;

DETAILED DESCRIPTION OF THE INVENTION

Figure 6:
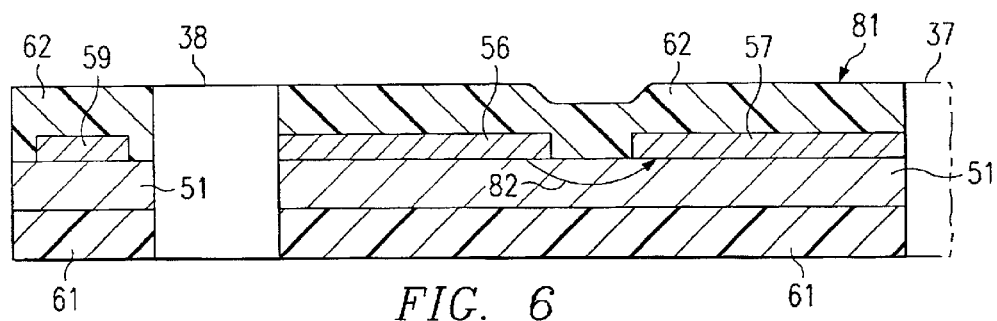
FIG. 6 is a diagrammatic sectional view similar to FIG. 4 but showing an alternative embodiment of an infrared detector element which embodies the present invention.

FIG. 1 is a diagrammatic perspective view of an infrared detector 10 which can sense thermal energy and output electrical signals representative of a two-dimensional image of that sensed thermal energy. The infrared detector 10 includes a focal plane array 12 disposed on a substrate 16. The substrate 16 includes an integrated circuit of a type which is commonly known as a read out integrated circuit (ROIC). The ROIC reads out the thermal information gathered by the focal plane array 12.

A thermal element 17 is provided on the side of the substrate 16 opposite from the focal plane array 12, in order to serve as a form of controlled heat sink which maintains the integrated circuit substrate 16 at a substantially constant temperature which is predefined. The constant temperature prevents ambient or internally generated temperature gradients from affecting operation of the focal plane 12, and thus provides a baseline with which the thermal energy impinging on the focal plane array 12 can be accurately measured.

The focal plane 12 includes a plurality of thermal sensors or detector elements, one of which is designated by reference numeral 21. The detector elements are arranged in a two-dimensional array, and each detector element 21 corresponds to a respective pixel in each image detected by the infrared detector 10. The focal plane array 12 of the disclosed embodiment includes 76,800 detector elements 21, which are arranged in a 320 by 240 array. For clarity, however, FIG. 1 diagrammatically depicts only about 140 detector elements. It will be recognized that the total number of detector elements 21 in the focal plane array 12 could be larger or smaller. Further, even though FIG. 1 shows the detector elements 21 arranged in a two-dimensional array, they could alternatively be arranged in a one-dimensional array, or could be provided at arbitrary locations that do not conform to a specific pattern. With reference to FIG. 2, one of the detector elements 21 of FIG. 1 will be described in more detail.

More specifically, FIG. 2 is a diagrammatic fragmentary perspective view of a portion of the integrated circuit substrate 16, which has one of the detector elements 21 on it. In the disclosed embodiment, the detector elements all have the same structural configuration, and therefore only one of them is illustrated and described here in detail. In this regard, the substrate 16 has on an upper surface thereof two spaced electrical contacts or pads 31 and 32, which are each electrically coupled in a not-illustrated manner to an ROIC that is implemented within the substrate 16. Two electrically conductive aluminum posts 33 and 34 are each electrically coupled to and extend upwardly from a respective one of the contacts 31 and 32. Two approximately L-shaped legs 37 and 38 each have one end supported on a respective one of the posts 33 and 34. The legs 33 and 34 are multi-layered parts, as discussed later. The opposite ends of the legs 37 and 38 support a multi-layered membrane 41, and the legs 37 and 38 each have other layers thereon, as described in more detail later.

The top surface of the substrate 16 may optionally have thereon a layer 42 of a material which reflects infrared radiation. A space or gap exists between the membrane 41 and the reflective layer 42, and the distance between them is selected to be approximately one-quarter of a wavelength of the infrared radiation of interest, so as to create a resonant cavity which effectively traps the radiation of interest until it can be absorbed by the membrane, in order to increase the amount of the received infrared radiation which is absorbed by the membrane 41. Although the distance between the membrane 41 and the reflective layer 42 is one-quarter wavelength, it may alternatively be some other appropriate distance, such as an odd multiple of one-quarter of a wavelength.

The legs 37–38 and the membrane 41 will now be described in more detail with reference to FIGS. 4 and 5. FIG. 4 is a diagrammatic sectional view taken along the line 4—4 in FIG. 2, and FIG. 5 is a diagrammatic sectional view taken along the line 5—5 in FIG. 4. Referring to FIGS. 2–5, the membrane 41 has several layers, including at the center a layer 51 of amorphous silicon. The layer 51 includes portions which extend out through each of the legs 37 and 38 to the region of the outer ends thereof. In the disclosed embodiment, the amorphous silicon layer 51 has a thickness of approximately 300–700 Å. The amorphous silicon 51 may be undoped, or may optionally have a small amount of p-type doping. The presence or absence of doping, and its level if present, are selected to provide a desired temperature coefficient of resistance (TCR). TCR is a standard measure of the rate at which the resistance of the layer 51 will vary in response to a change in its temperature. TCR thus represents the sensitivity of the membrane 41 for purposes of detecting thermal radiation. A high value for TCR is desirable, in order to have a high level of sensitivity for purposes of detecting thermal radiation. Variation from no doping through low and medium-level doping to high-level doping permits the selection of a desired TCR value from a range of approximately 2.3 to 11.5%/K.

On the underside of the amorphous silicon 51 is an electrically conductive bottom electrode 53, which in the disclosed embodiment is substantially coextensive in length and width with the layer 51, and which is not directly electrically coupled to any circuitry external to the membrane 41. In this regard, it will be noted from the drawings that the layer 53 does not have portions which extend out through the legs 37 and 38.

Two spaced upper electrodes 56 and 57 are provided on the upper side of the layer 51, and are each made from an electrically conductive material. In the disclosed embodiment, the electrodes 56 and 57 are each made from a titanium and aluminum alloy with approximately 50% aluminum and 50% titanium, but the amounts of aluminum and titanium could alternatively be varied. As best seen in FIG. 5, the electrodes 56 and 57 are each of approximately rectangular shape, the nearest side edges thereof being spaced and parallel. The electrodes 53 and 56–57 are each in ohmic contact with the amorphous silicon 51.

Conductive strips 58 and 59, which technically are integral parts of the respective electrodes 56 and 57, each extend from a respective one of the electrodes 56 and 57 out through a respective one of the legs 37 and 38 to a respective one of the posts 33 and 34, where the strips 58 and 59 are respectively electrically coupled to the posts 33 and 34. The strips 58 and 59 are made from the same material as the electrodes 56 and 57. As best seen in FIG. 4, the strips 58 and 59 are each somewhat narrower in width than the associated leg 37 or 38.

The aluminum and titanium alloy used for the strips 58–59 and for the electrodes 53 and 56–57 is electrically conductive, but can also absorb infrared radiation where, as here, it is in the form of a layer which is sufficiently thin so that it tends to absorb rather than reflect the infrared radiation. In the disclosed embodiment, the strips 58–59 and the electrodes 53 and 56–57 each have a thickness of approximately 100–200Å.

The membrane 41 further includes bottom and top insulating layers 61–62. In the disclosed embodiment, the insulating layers 61–62 are made from a dielectric material such as silicon nitride (SiN), but they could alternatively be made from some other suitable insulating material. The bottom insulating layer 61 is provided on the underside of the electrode 53, and is substantially coextensive in length and width with the electrode 53. The top insulating layer 62 is provided on top of the electrodes 56 and 57, and also in the region between them, and has substantially the same length and width as the bottom electrode 53. The bottom insulating layer 61 has a thickness in the range of approximately 200–1000 Å. The portion of the top insulating layer 62 above the electrodes 56–57 has a thickness in the range of approximately 200–1500 Å. The top and bottom insulating layers 61–62 help rigidity the membrane 41, so as to keep it approximately planar in view of the fact that it has no structural support directly beneath it. Further, the insulating layers 61–62 serve to passivate the metal surfaces of the electrodes 53 and 56–57, so as to limit oxidation of these surfaces. The layers 61–62 each include a striplike portion that extends out through a respective one of the legs 37–38 to the outer end thereof.

As is well known, there is a progressive increase in the effective resistance of amorphous silicon as the level of p-type doping is progressively decreased. According to a feature of the present invention, the effective resistance of the amorphous silicon layer 51 within the membrane 41 can be selected in a manner which is independent of the doping level. This is achieved by appropriately configuring the amorphous silicon layer 51 and also the size and positions of the electrodes 53 and 56–57, so as to control the effective distance and area in the amorphous silicon through which current must pass as it flows between the electrodes.

With reference to FIG. 4, current flows from the electrode 56 to the electrode 53 through a short distance and over a relatively wide area, and then flows from the electrode 53 to the electrode 57, again through a short distance and over a relatively wide area. As a result of this configuration, the effective resistance provided by the amorphous silicon layer 51 between the electrodes 56–57 can be selected to have a desired value which is suitably low, even though the amorphous silicon layer 51 has little or no doping and thus has a relatively high resistivity, in comparison to other thermally sensitive materials. The embodiment of FIGS. 2–5 can thus be configured to have no doping or low-level doping of the amorphous silicon layer 51, in order to obtain a high TCR and a high level of sensitivity, while realizing a resistance which is selected independently of the doping so as to be in the range of approximately 10 KΩ to approximately 1000 KΩ. This permits the impedance of the detector element 21 to be matched to the input impedance requirement of a pre-existing ROIC of a known type that uses a pulsed-bias mode read out technique.

Further, by use of no doping or low-level doping, and by adjusting the thickness of the layer 51 and/or the area or placement of the electrodes 53, 56 and 57, the effective resistance can be set to a selected value within a range of 30 MΩ–100 MΩ, which is compatible with integrating amplifiers of a known type that are used to detect and read out information present in the detector element 21 as a result of received thermal energy. In short, the impedance of the detector element can be matched to an ROIC input impedance over a relatively wide range, while using little or no doping, in order to obtain a high TCR value.

As noted above, the electrodes 53 and 56–57 are made of an aluminum and titanium alloy, which has been selected because it can be deposited in a thickness where it absorbs infrared radiation while maintaining a usable direct current conductivity. Thus, the electrodes 53 and 56–57 can each directly absorb thermal radiation and deliver it to the amorphous silicon layer 51, without any need for a special additional layer which is separate from the electrodes and which is provided solely for the purpose of absorbing infrared radiation. By avoiding the need for such a dedicated absorber layer, there is greater flexibility for structurally configuring the layer 51 and the electrodes 53 and 56–57 so as to achieve the desired resistance through the amorphous silicon layer 51 between the electrodes.

FIG. 6 is a diagrammatic sectional view similar to FIG. 4, but showing a membrane 81 which is an alternative embodiment of the membrane 41 shown in FIGS. 2–5. In this regard, the membrane 81 of FIG. 6 is generally similar to the membrane 41, except that the bottom electrode shown at 53 in FIG. 4 has been omitted from the membrane 81 of FIG. 6. This means that the current flow through the amorphous silicon layer 51 travels from the electrode 56 to the electrode 57, as shown diagrammatically by arrow 82. As with the membrane 41 of FIGS. 2–5, the silicon layer 51 and the electrodes 56–57 are structurally configured with respect to each other so that the effective length and area in layer 51 which is subject to current flow provides an effective resistance for the membrane 81 which can be selected independently of the extent to which doping is or is not provided within the layer 51.

Figure 7:
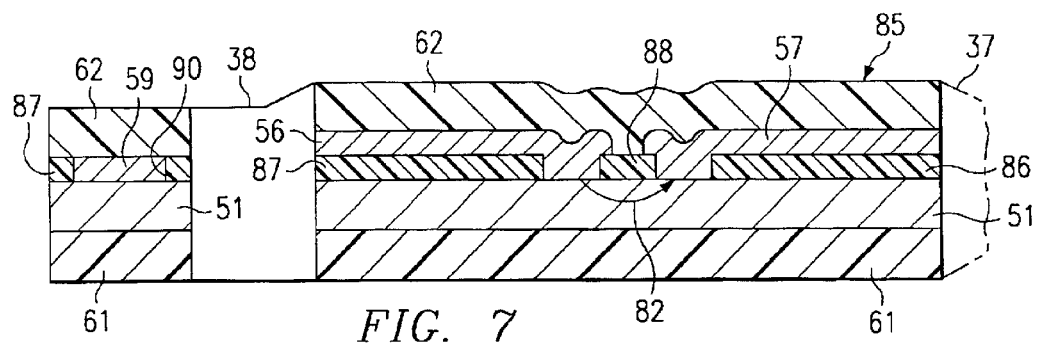
FIG. 7 is a diagrammatic sectional view similar to FIG. 6 but showing a further alternative embodiment of an infrared detector element which embodies the present invention.
Figure 8:
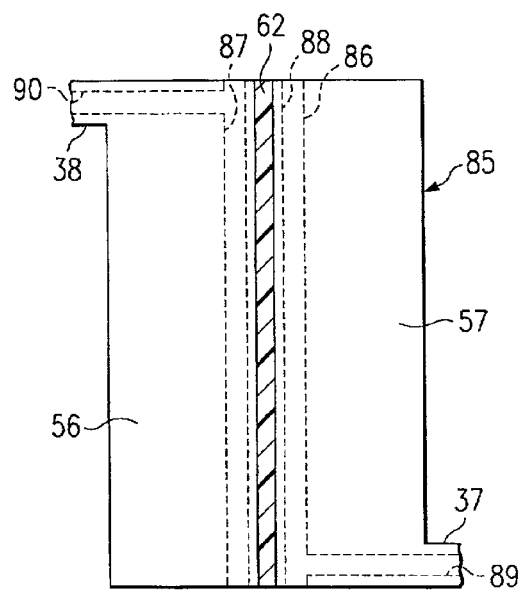
FIG. 8 is a diagrammatic sectional top view similar to FIG. 5, but showing the embodiment of FIG. 7.

FIG. 7 is a diagrammatic view similar to FIG. 6, but showing a membrane 85 which is a further embodiment of the invention. FIG. 8 is a diagrammatic sectional top view similar to FIG. 5, but showing the membrane 85 of FIG. 7. The membrane 85 of FIGS. 7 and 8 is similar to the membrane 81 of FIG. 6, except for the differences described below. In particular, the membrane 85 has on top of the layer 51 a pair of spaced layers 86 and 87 of an insulating material such as silicon nitride (SiN), with a strip 88 of this same insulating material disposed between and spaced from each of the layers 86 and 87. The strip 88 is slightly wider than the distance between the adjacent edges of the electrodes 56 and 57. The portions 86–88 of the insulating material each have a thickness of about 250–350Å.

The adjacent edges of electrodes 56 and 57 are spaced by a distance of about 1 micron. The electrode 56 is in ohmic contact with the amorphous silicon layer 51 between the layer 86 and the strip 88, and the electrode 57 is in ohmic contact with the layer 51 between the layer 87 and the strip 88. The inclusion of the silicon nitride portions 86–88 serves to enhance the rigidity of the membrane 85.

The layers 86 and 87 each include a portion which extends out to the end of a respective one of the legs 37 or 38, and which has a respective trench 89 or 90 etched in it. The conductive strips 58–59 which are parts of the respective electrodes 56–57 are each disposed within a respective one of the trenches 89–90. As a result, the conductive material of the strips 58–59 and the electrodes 56–57 is in ohmic contact with the top surface of the amorphous silicon layer 51 from the posts 33–34 all the way to the region between the insulating portions 86 and 88 and the region between the insulating portions 87 and 88. This ensures that the conductive material includes portions which extend from the posts to these regions without any sections or "steps" where the conductive material has to leave the layer 51 and travel over a part of the insulating portions 86–87. Since the conductive material 56–59 has a thickness somewhat less than the thickness of the insulating portions 86–88, the existence of such a step would make it more difficult to ensure continuous and relatively uniform thickness and conductivity of the conductive portions from the membrane all the way out to the posts 33–34. The disclosed embodiment thus ensures that there is a continuous path out to each post without any such step, even though other parts of the conductive portions 56–57 are disposed on top of the insulating portions 86–88.

During fabrication of the membrane 85, a layer of silicon nitride is deposited on the amorphous silicon layer 51, and then a masked etch is carried out to expose selected portions of the layer 51. This includes creation of the trenches 89–90, and formation of the insulating portions 86–88 having trenches therebetween. Then, a layer of metalization is deposited over the resulting structure, and a further masked etch is carried out to define the electrodes 56–57 and the conductive strips 58–59.

Figure 9:
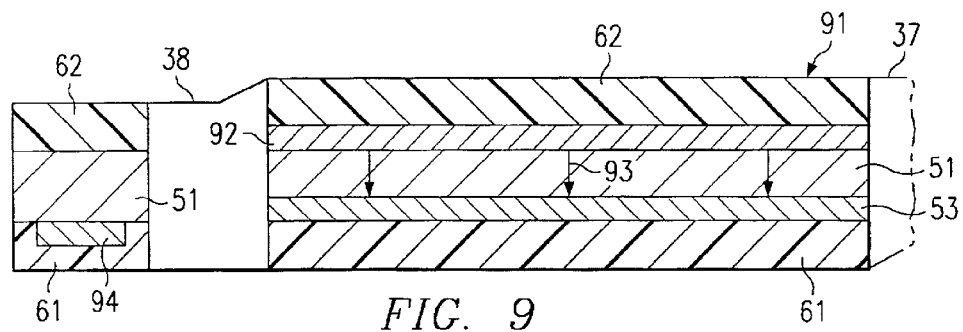
FIG. 9 is a diagrammatic view similar to FIG. 4 but showing yet another alternative embodiment of an infrared detector element which embodies the present invention.

FIG. 9 is a diagrammatic sectional view similar to FIG. 4, but showing a membrane 91 which is an alternative embodiment of the membrane 41 of FIG. 4. The membrane 91 is generally similar to the membrane 41, except as described below. In particular, the two electrodes 56–57 of the membrane 41 in FIG. 4 have been replaced with a single top electrode 92 in the membrane 91, the electrode 92 having a length and width which are coextensive with the length and width of the amorphous silicon layer 51 and the bottom electrode 53. Further, the top electrode 92 is integral with a not-illustrated conductive strip, which is similar to the strip 58 (FIG. 5) and which extends out through the leg 37 to the post 33. The bottom electrode 53 is integral with a conductive strip 94, which extends out through the leg 38 to the post 34.

As indicated by arrow 93, current flows from the top electrode 92 to the bottom electrode 53 across a relatively short distance and a relatively wide area within the amorphous silicon layer 51. As with other embodiments described above, the absence of doping or the level of doping within amorphous silicon layer 51 is selected to obtain a desired TCR value. Further, the layer 51 and the electrodes 53 and 92 are structurally configured so that the layer 51 provides the membrane 91 with a desired level of resistance, which is selected independently of any doping, and which can be selected to match the impedance of the membrane 91 to the input impedance of an associated ROIC circuit.

Figure 10:
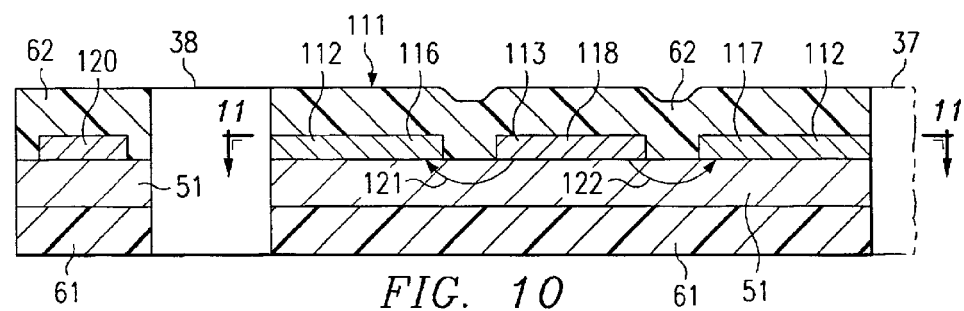
FIG. 10 is a diagrammatic sectional view similar to FIG. 4 but showing still another alternative embodiment of an infrared detector element which embodies the present invention.
Figure 11:
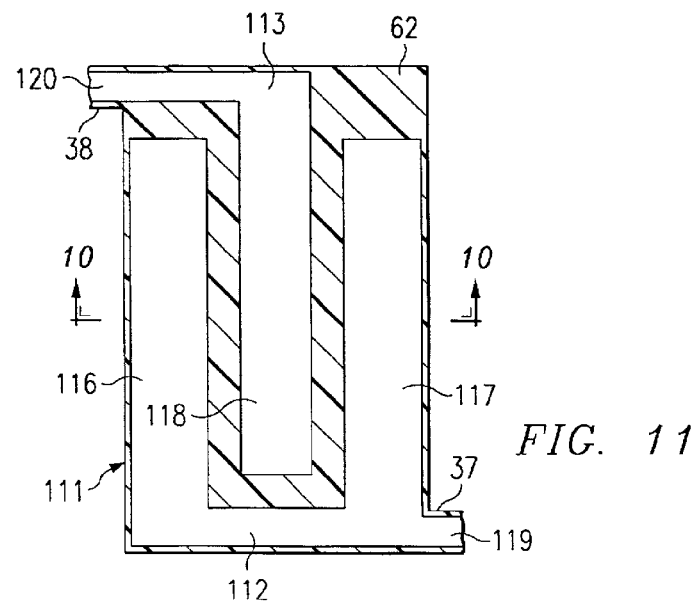
FIG. 11 is a diagrammatic sectional view taken along the line 11—11 in FIG. 10.

FIGS. 10 and 11 show a further membrane 111 which is an alternative embodiment of the membrane 81 shown in FIG. 6. FIG. 10 is a diagrammatic sectional view similar to FIG. 6, and FIG. 11 is a diagrammatic sectional view taken along the line 11—11 in FIG. 10. For clarity, FIG. 11 includes a section line 10—10 corresponding to the view of FIG. 10. In FIGS. 10 and 11, the membrane 111 is generally similar to the membrane 81 of FIG. 6, except as described below. In particular, the electrodes 56 and 57 in FIG. 6 have been replaced with two electrodes 112 and 113 that have a different configuration. As best seen in FIG. 11, the electrode 112 has two fingers 116 and 117, and the electrode 113 has a finger 118 which is disposed between the fingers 116 and 117, in a manner so that there is an approximately uniform spacing between the electrodes 112 and 113 at almost all locations along the outer edge of the electrode 113. In the disclosed embodiment, the uniform spacing between the electrodes is approximately 1 micron.

Two conductive strips 119 and 120 are each integral with a respective one of the electrodes 112 and 113, and each extend through a respective one of the legs 37 and 38 to a respective one of the posts 33–34. The strips 119–120 are each somewhat narrower than the associated leg 37 or 38.

It will be recognized that, although the electrode 112 has two fingers and the electrode 113 has one finger in FIG. 10, the electrode 113 could have a larger number of fingers, and the electrode 112 could have a larger or smaller number of fingers, so long as the fingers of the two electrodes are interdigitated.

The arrows 121 and 122 in FIG. 10 show how current can flow through the amorphous silicon layer 51 from the electrode 113 to the electrode 112. As discussed above in association with other embodiments, the amorphous silicon layer 51 of the membrane 111 can be undoped or can be doped to a selected level, in order to provide the layer 51 with a desired TCR. The configuration of the electrodes 112 and 113 and the spacing between them is selected so that the amorphous silicon layer 51 provides between the electrodes 112 and 113 an effective resistance which has a desired value that has been selected independently of the TCR and any doping that may be present.

Figure 12:
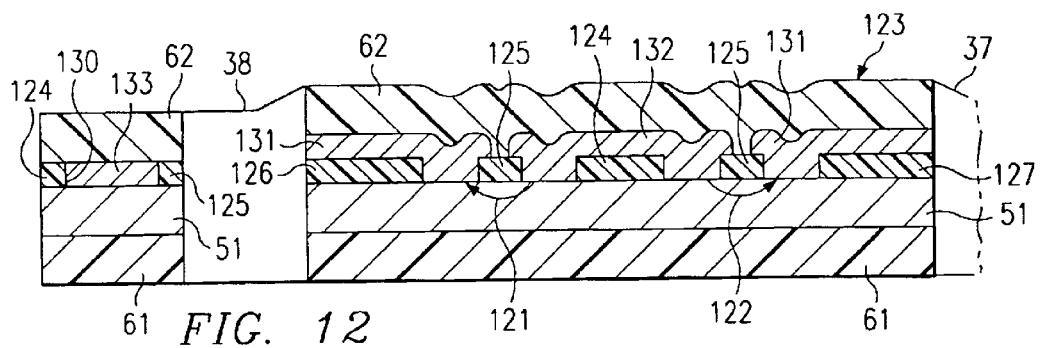
FIG. 12 is a diagrammatic sectional view similar to FIG. 10, but showing yet another alternative embodiment of an infrared detector element which embodies the present invention.
Figure 13:
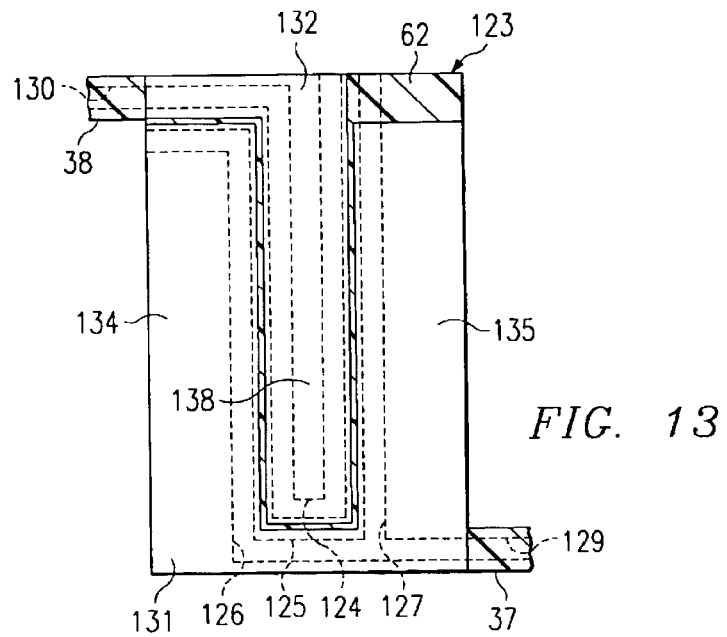
FIG. 13 is a diagrammatic sectional view similar to FIG. 11, but showing the infrared detector element of FIG. 12.

FIGS. 12 and 13 show a membrane 123, which is an alternative embodiment of the membrane 111 shown in FIGS. 10–11. More specifically, FIG. 12 is a diagrammatic sectional view similar to FIG. 10, and FIG. 13 is a diagrammatic sectional view similar to FIG. 11. The membrane 123 of FIGS. 12–13 is generally similar to the membrane 111 of FIGS. 10–11, except for the differences described below.

During fabrication of the membrane 123, a layer of an insulating material such as silicon nitride is deposited on the amorphous silicon layer 51 with a thickness of about 250–350 Å, and is then etched to create four separate portions 124–127, which are indicated in FIG. 12 by broken lines. This etching step includes the creation of trenches 129–130 through the insulating material which is in the legs 37–38. A metalization layer is then deposited, and is etched to create two electrodes 131–132, and associated conductive strips in the respective trenches 129–130, one of the conductive strips being visible at 133 in FIG. 12. The insulating layer 62 is then deposited over the resulting structure.

The adjacent edges of the electrodes 131–132 are spaced by a distance of approximately 1 micron. The electrodes 131–132 have interdigitated fingers, including two spaced fingers 134–135 (FIG. 13) which are part of the electrode 131, and one finger 138 (FIG. 13) which is part of the electrode 132 and which is disposed between the fingers 134–135. The electrode 131 contacts the amorphous silicon layer 51 through a trench which is defined by the region between the insulating portion 125 and the insulating portions 126–127, and the electrode 132 contacts the amorphous silicon layer 51 through a further trench which is defined by the region between the insulating portion 124 and the insulating portion 125.

It will be noted that the width of the insulating portion 125 determines the distance which current must flow through the amorphous silicon layer 51, and thus determines the resistivity of the membrane 123. The combined area of the electrodes 131–132 covers substantially the entire membrane, except primarily for the gap between their adjacent edges. Moreover, since the electrodes 131–132 each have an overall area which is significantly larger than its area of contact with the amorphous silicon layer 51, each electrode can efficiently absorb infrared radiation across its entire area, while the area of contact between each electrode and the amorphous silicon layer 51 is much smaller and can be controlled in size and placement through control of the width and placement of the trench between the insulating portions 125 and 126–127 or the trench between the insulating portions 124–125.

Figure 14:
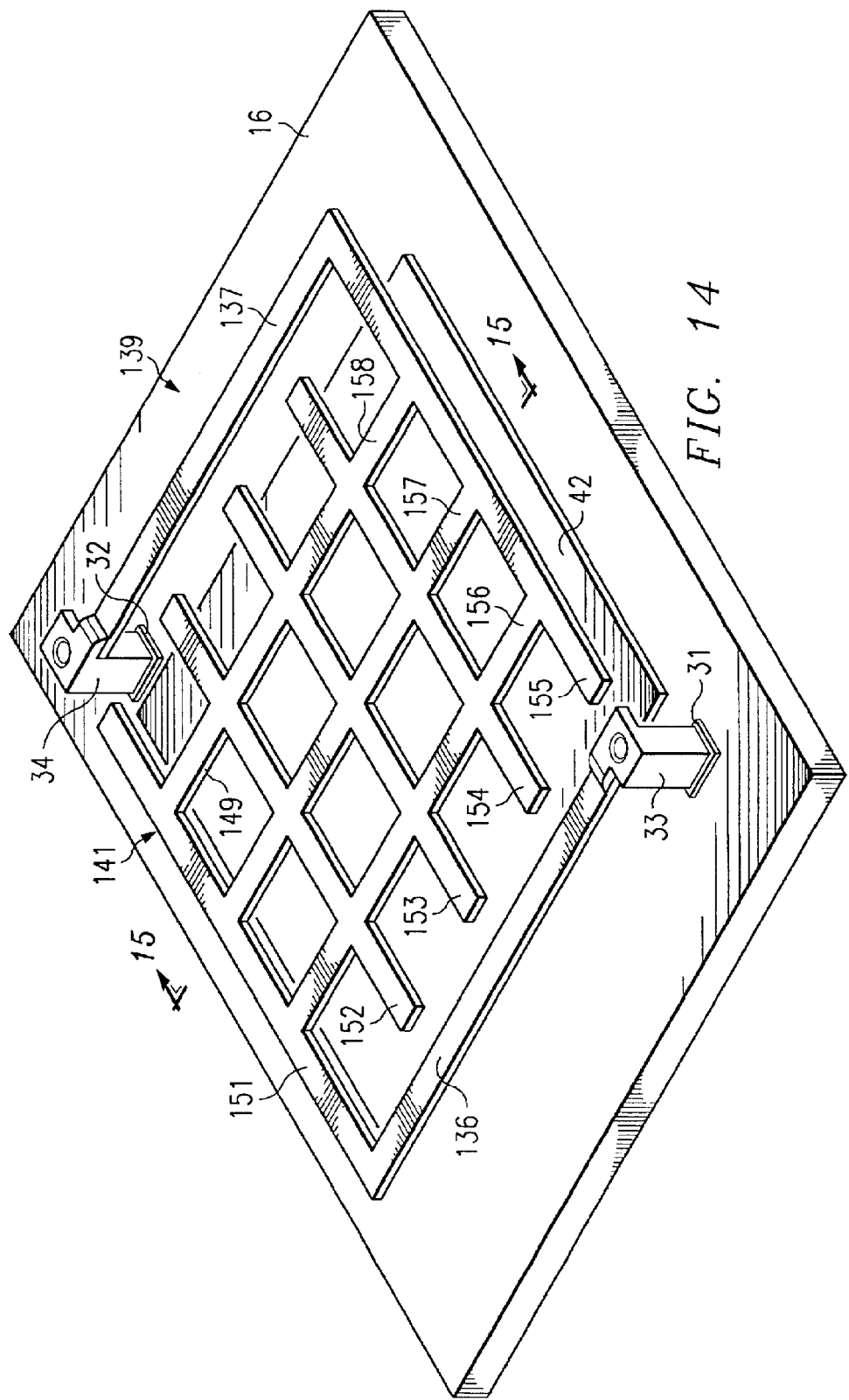
FIG. 14 is a diagrammatic perspective view of a detector element which is an alternative embodiment of the detector element of FIG. 2.

FIGS. 14–17 depict a detector element 139 which is an alternative embodiment of the detector element 21 shown in FIG. 2. FIG. 14 is a diagrammatic perspective view showing a portion of the substrate 16 which has thereon the reflective layer 42, the contacts 31–32, and the posts 33–34 on the contacts, in a manner similar to that already described above in association with FIG. 2. Two horizontally extending legs 136–137 each have one end secured to an upper end of a respective one of the posts 33–34, and the other ends of the legs 136–137 support a membrane 141 at a location spaced above the reflective layer 42.

Figure 15:
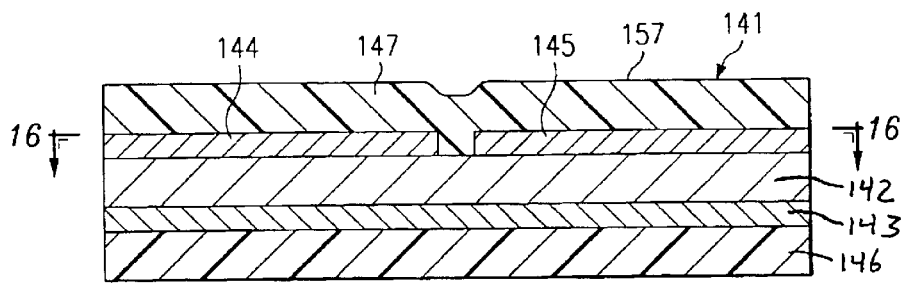
FIG. 15 is a diagrammatic sectional view taken along the line 15—15 in FIG. 14.
Figure 16:
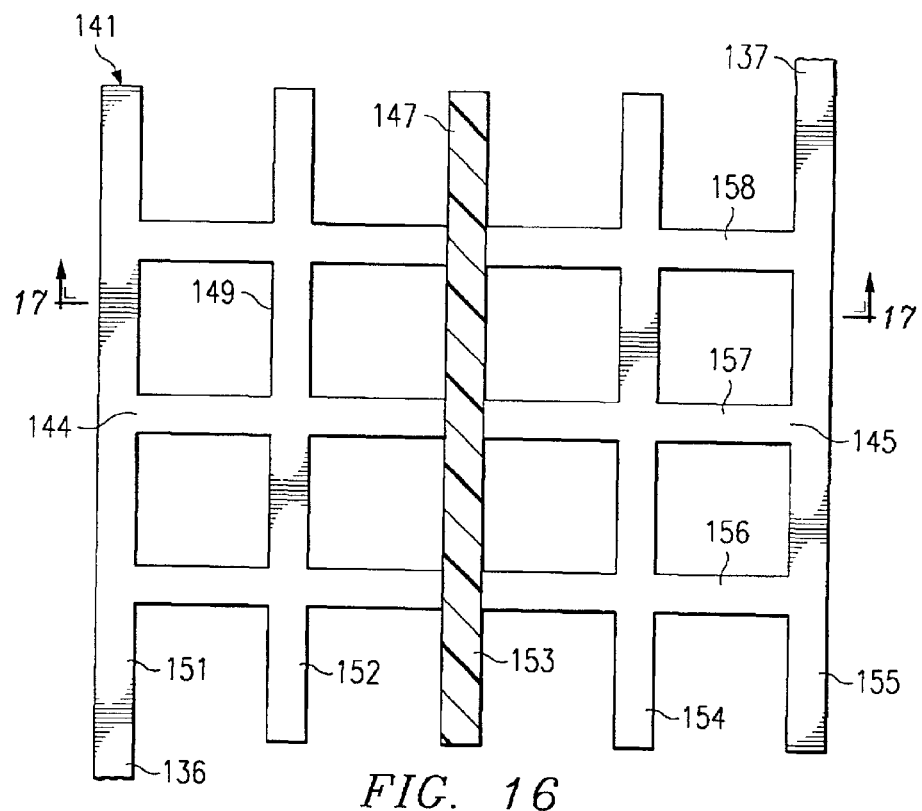
FIG. 16 is a diagrammatic sectional view taken along the line 16—16 in FIG. 15.
Figure 17:
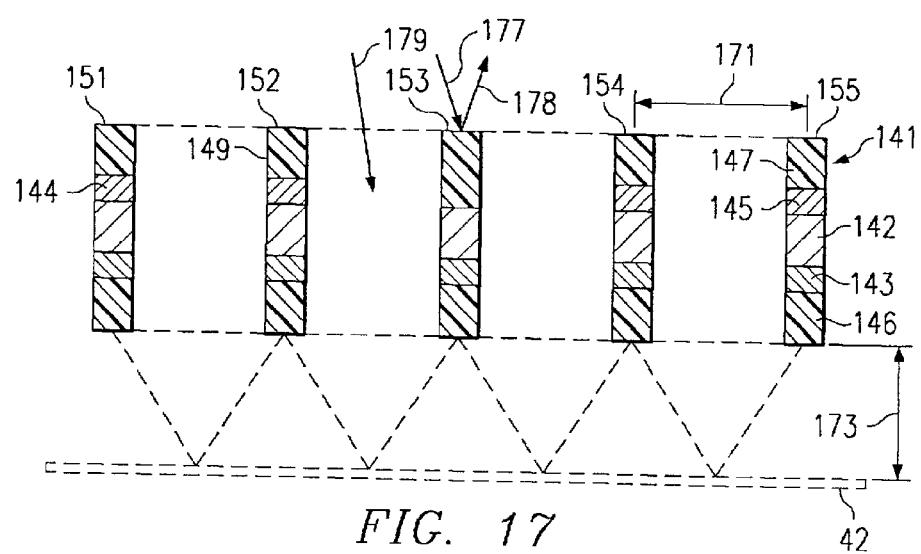
FIG. 17 is a diagrammatic sectional view taken along the line 17—17 in FIG. 16.

The membrane 141 is described in more detail with reference to FIGS. 15–17. In this regard, FIG. 15 is a diagrammatic sectional side view of the membrane 141 taken along the line 15—15 in FIG. 14, FIG. 16 is a diagrammatic sectional plan view taken along the line 16—16 in FIG. 15, and FIG. 17 is a diagrammatic sectional side view taken along the line 17—17 in FIG. 16. FIG. 17 also diagrammatically depicts the reflective layer 42. For clarity in showing the present invention, FIG. 17 is not to scale.

As best seen in FIG. 15, the membrane 141 is a multilayer member, where the arrangement of layers in a vertical direction is generally similar to that shown in FIG. 4. In particular, there is an amorphous silicon layer 142, a bottom electrode 143 on the underside of the amorphous silicon layer 142, and two spaced top electrodes 144 and 145 on the top surface of the amorphous silicon layer 142. The amorphous silicon layer 142 and the electrodes 143–145 are sandwiched between top and bottom insulating layers 146 and 147. The thicknesses and materials used for the elements 142–147 are the same as the thicknesses and materials used for the corresponding elements in the embodiment of FIG. 4. The legs 136 and 137 each have multiple layers corresponding to respective layers of the membrane 141, except that neither leg has a layer corresponding to the bottom electrode 143.

One significant difference between the membrane 141 of FIGS. 14–17 and the membrane 41 of FIGS. 4–5 is that the membrane 141 has 16 openings 149 provided through it, in a pattern which forms a four-by-four array of openings. Due to the presence of the openings, the membrane 141 may be viewed as having five spaced and parallel strips 151–155 that extend in one direction, and three spaced and parallel strips 156–158 that extend from the strip 151 to the strip 155 in a direction perpendicular to the strips 151–155. FIG. 14 provides a good view of the electrodes 144 and 145, along with a portion of the insulating layer 147 which is disposed between these electrodes. In the embodiment of FIGS. 14–17, the legs 136 and 137 each have a width of approximately 0.75 μm, and the strips 151–158 each have a width of approximately 1.25 μm. Referring to FIG. 17, the distance 171 between the centers of any two adjacent strips 151–158 is approximately 5.75 μm. The vertical distance between the reflective layer 42 and the membrane 141 is approximately 2.5 μm, which is approximately one-quarter of a wavelength of the infrared radiation of interest.

However, even though the distance between the membrane 141 and the reflective layer 42 is one-quarter wavelength, it may alternatively be some other appropriate distance, such as an odd multiple of one-quarter of a wavelength.

A brief description will now be provided of the operation of the disclosed embodiments, beginning with the embodiment of FIGS. 1–5. With reference to FIG. 4, arriving infrared radiation will impinge on the top surface of the membrane 41, as indicated diagrammatically by arrow 162. A small portion of this radiation may be reflected, as indicated diagrammatically by arrow 163. However, most of the radiation 162 will travel into the membrane 41, where it will be absorbed by one of the electrodes 53 or 56–57. These electrodes transfer absorbed thermal energy to the amorphous silicon layer 51. As the temperature of the amorphous silicon layer 51 changes, the resistance provided by this layer between the electrodes 56 and 53 and between the electrodes 53 and 57 will vary at rate corresponding to the TRC. Consequently, by measuring the cumulative resistance currently provided by the amorphous silicon layer 51 between the electrodes 56–57, an external ROIC disposed in the substrate 16 (FIG. 2) can determine the amount of thermal energy which has been absorbed by the membrane 41.

Some of the thermal energy 162 which enters the membrane 41 may pass entirely through the membrane 41. With reference to FIG. 2, it will then be reflected by the reflective layer 42. As mentioned above, the distance between membrane 41 and reflective layer 42 has been selected to be approximately one-quarter of a wavelength of the infrared radiation of interest. As a result, the space between the membrane 41 and the reflective layer 42 forms a resonant cavity which effectively traps this radiation until it travels upwardly back into the membrane 41, where it is absorbed by the electrodes. As noted above, the distance between the membrane 41 and the reflective layer 42 is one-quarter wavelength, it may alternatively be some other appropriate distance, such as an odd multiple of one-quarter of a wavelength.

The embodiments of FIGS. 6–11 each operate in a manner similar to that just described for the embodiment of FIGS. 1–5, except to the extent that each such embodiment has a different configuration of electrodes and thus a different path for current flow through the amorphous silicon layer 51. Accordingly, it is believed that the operation of these embodiments will be self-evident in view of the foregoing discussion of the embodiment of FIGS. 1–5, and that a detailed discussion of the operation of each of these embodiments is thus unnecessary here.

Turning to the embodiment of FIGS. 14–17, and as shown in FIG. 17, a portion of the radiation arriving at the thermal detector 141 is indicated diagrammatically by an arrow 177, and will impinge directly on the upper side of one of the strips 151–158. A small portion of this may be reflected, as indicated by arrow 178. However, most of the radiation 177 will pass into the membrane 141, and will be handled in a manner similar to that discussed above in association with the embodiment of FIGS. 1–5.

As indicated diagrammatically by arrow 179 in FIG. 17, a substantial portion of the radiation arriving at membrane 141 does not impinge directly on the membrane, but instead passes through one of the openings 149 and is then reflected by the reflective layer 42. The width of the strips 151–158, the spacing 171 between the strips, and the distance 173 between the membrane 141 and the reflective layer 42 are all selected so that the region between the membrane 141 and the reflective layer 42 is a resonant cavity that traps infrared radiation having wavelengths of interest, notwithstanding the presence of openings 149 through the membrane 141. In particular, energy from the incident radiation 179 is diffracted by the cross-grating membrane 141 into higher order, non-propagating evanescent cavity modes, which appear within the diffractive resonant cavity. Thus, the radiation 179 which initially passes through the membrane 141 will be trapped within the resonant cavity until it is absorbed by one of the strips 151–158.

In other respects, operation of the embodiment of FIGS. 14–17 is generally similar to the operation described above for the embodiment of FIGS. 1–5. It will be recognized that the embodiment of FIGS. 14–17 is capable of absorbing infrared radiation approximately as efficiently as the embodiment of FIGS. 1–5, but has a much smaller physical and thermal mass. Due to the reduced thermal mass, it is possible to achieve a low thermal time constant, for example less than 5 msec.

The present invention provides a number of technical advantages. One such technical advantage results from the fact that the invention uses amorphous silicon. Amorphous silicon permits a higher level of TCR, so as to realize significantly increased sensitivity in measuring thermal radiation. A further advantage is that, by selecting an appropriate configuration for the amorphous silicon material and the associated electrodes, a desired resistance at a selected temperature can be implemented generally independently of the level of doping and the TCR value. This permits pixel impedance to be matched to ROIC impedance over a wide range, thereby permitting amorphous silicon based detector elements to be used with existing ROIC circuits, including pulsed-bias mode current skimming ROIC designs commonly used with vanadium oxide detector elements, as well as direct current bias switched capacitor integrating amplifier per unit cell ROIC designs.

A further advantage is that the mass of the membrane of each detector element is reduced, which increases pixel response by lowering the thermal mass, at no cost to absorption efficiency. As such, a very low thermal time constant is realized, which in turn contributes to a relatively high operating speed, for example up to a 100 Hz frame rate using an f/1 optical system. A further advantage results from the implementation of the electrodes with a material which is electrically conductive and which can also absorb thermal radiation, thereby avoiding the need for a separate layer or element which is dedicated to absorbing thermal radiation within the membrane.

Although several selected embodiments have been illustrated and described in detail, it should be understood that various substitutions and alterations can be made therein without departing from the present invention. For example, several different membranes have been disclosed which have various different configurations of the electrodes and amorphous silicon layer, but it will be recognized that there are also a variety of other configurations that also fall within the scope of the present invention. Further, one disclosed membrane has openings therethrough which are arranged in a regular pattern. However, it will be recognized that the size and spacing of the openings could be varied, and that the openings could be provided in some other regular or irregular configuration. Other substitutions and alterations are also possible without departing from the spirit and scope of the present invention, as defined by the following claims.

What is claimed is:

1. An apparatus, comprising an infrared detector with a plurality of detector elements that each include:

an amorphous silicon portion which has a selected temperature coefficient of resistance; and first and second electrodes which are electrically coupled to said amorphous silicon portion at spaced locations thereon, said first and second electrodes and said amorphous silicon portion having a structural configuration which is selected to provide between said first and second electrodes through said amorphous silicon portion at a given temperature a resistance which is selected substantially independently of said temperature coefficient of resistance;

wherein said amorphous silicon portion is a layer having each of said first and second electrodes on one side thereof; and including a third electrode on a side of said amorphous silicon layer opposite from said first and second electrodes, said third electrode having respective portions which are each aligned with a respective one of said first and second electrodes;

wherein said first and second electrodes are made of a material which absorbs thermal energy, are in thermal communication with said amorphous silicon portion, and are sufficiently thin so that they are substantially absorbing to infrared radiation; and wherein said electrodes are made from an alloy which includes aluminum and titanium.

2. An apparatus according to claim 1, wherein said alloy used for said electrodes includes approximately equal amounts of aluminum and titanium.

3. An apparatus according to claim 1, wherein said amorphous silicon portion has a level of doping selected to provide said amorphous silicon portion with said selected temperature coefficient of resistance; and wherein said structural configuration of said electrodes and said amorphous silicon portion is selected to set said resistance substantially independently of said doping level.

4. An apparatus according to claim 1, wherein said infrared detector includes an integrated circuit, a membrane having therein said amorphous silicon portion and said electrodes, and structure which supports said membrane at a location spaced above said integrated circuit and which electrically couples each of said first and second electrodes to said integrated circuit.

5. An apparatus according to claim 4, wherein said integrated circuit has thereon below said membrane a reflective surface which reflects infrared radiation; and wherein a distance between said reflective surface and said membrane is selected as a function of infrared wavelengths of interest, so that a region between said membrane and said reflective surface will serve as a resonant cavity for said wavelengths of interest.

6. An apparatus according to claim 5, wherein said membrane has therethrough a plurality of openings.

7. An apparatus according to claim 6, wherein said openings each have a transverse dimension which is approximately twice said distance.

8. An apparatus according to claim 1, including spaced first and second layers made of a material which is electrically insulating and substantially transparent to infrared radiation, said amorphous silicon layer and said electrodes being disposed between said first and second layers.

9. A method of making an infrared detector having a plurality of detector elements, comprising the steps of:

providing an amorphous silicon layer which has a selected temperature coefficient of resistance;

fabricating first and second electrodes which are at spaced locations on one side of said amorphous silicon layer and which are electrically coupled to said amorphous silicon layer, including the step of selecting as a material for said first and second electrodes an alloy which contains titanium and aluminum, and the step of structurally configuring said first and second electrodes and said amorphous silicon layer so as to provide between said first and second electrodes through said amorphous silicon layer at a given temperature a resistance selected substantially independently of said temperature coefficient of resistance; and fabricating a third electrode from said alloy on a side of said amorphous silicon layer opposite from said first and second electrodes, said third electrode having respective portions which are each aligned with a respective one of said first and second electrodes.

10. A method according to claim 9, wherein said step of selecting said alloy includes selecting said alloy to have approximately equal amounts of aluminum and titanium.

11. A method according to claim 9, wherein said step of providing said amorphous silicon layer includes the step of doping said amorphous silicon layer to a level which provides said selected temperature coefficient of resistance; and wherein said steps of fabricating said third electrode and configuring said first and second electrodes and said amorphous silicon layer are carried out so as to set said resistance substantially independently of said doping level.

12. A method according to claim 9, wherein said step of fabricating said first and second electrodes includes the steps of forming said first and second electrodes from a material which absorbs thermal energy and which is in thermal communication with said amorphous silicon layer, and forming said first and second electrodes to be sufficiently thin so that they are substantially absorbing to infrared radiation.

13. A method according to claim 9, further including the steps of:

supporting at a location spaced above an integrated circuit a membrane which has therein said amorphous silicon layer and said electrodes;

electrically coupling said first and second electrodes to said integrated circuit; and providing on said integrated circuit below said membrane a reflective surface which reflects infrared radiation, wherein a distance between said reflective surface and said membrane is selected as a function of infrared wavelengths of interest, so that a region between said membrane and said reflective surface will serve as a resonant cavity for radiation having said wavelengths of interest.

14. An apparatus comprising an infrared detector having a plurality of detector elements that each include:

a thermally sensitive portion which has an electrical characteristic that varies as a function of a temperature of said thermally sensitive portion; and structure which is made of an alloy containing titanium and aluminum, which is thermally coupled to said thermally sensitive portion, which absorbs thermal energy from infrared radiation that impinges on the detector element, and which transfers thermal energy to said thermally sensitive portion.

15. An apparatus according to claim 14, wherein said structure includes first and second electrodes that are electrically coupled to said thermally sensitive portion at spaced locations thereon, said first and second electrodes being electrically and thermally conductive, and being sufficiently thin so that they absorb infrared radiation; and including circuitry which is electrically coupled to said first and second electrodes, and which is capable of measuring said electrical characteristic of said thermally sensitive portion through said electrodes.

16. An apparatus according to claim 15, wherein said infrared detector includes a substrate having said circuitry therein; and wherein each said detector element includes a membrane supported in spaced relation to said substrate and having therein said thermally sensitive portion and said first and second electrodes.

17. An apparatus according to claim 15, wherein said thermally sensitive portion includes amorphous silicon.

18. An apparatus according to claim 14, including first and second electrodes that are electrically coupled to said thermally sensitive portion at spaced locations thereon, said first and second electrodes being electrically conductive;

including circuitry which is electrically coupled to said first and second electrodes, said circuitry being capable of measuring said electrical characteristic of said thermally sensitive portion through said electrodes; and wherein said structure includes a layer which is made of said alloy, which is spaced from said electrodes, and which is sufficiently thin so that it absorbs infrared radiation.

19. An apparatus according to claim 18, wherein said infrared detector includes a substrate having said circuitry therein; and wherein each said detector element includes a membrane supported in spaced relation to said substrate and having therein said thermally sensitive portion, said layer, and said first and second electrodes.

20. An apparatus according to claim 18, wherein said layer is a further electrode, said first and second electrodes being disposed on one side of said thermally sensitive portion and said further electrode being disposed on an opposite side of said thermally sensitive portion.

21. An apparatus according to claim 18, wherein said thermally sensitive portion includes amorphous silicon.

22. A method of making an infrared detector having a plurality of detector elements, comprising the steps of:

providing a thermally sensitive portion which has an electrical characteristic that varies as a function of a temperature of said thermally sensitive portion; and fabricating structure which is made of an alloy containing titanium and aluminum, which is thermally coupled to said thermally sensitive portion, which absorbs thermal energy from infrared radiation that impinges on the detector element, and which transfers thermal energy to said thermally sensitive portion.

23. A method according to claim 22, wherein said step of fabricating said structure includes the step of fabricating first and second electrodes that are electrically coupled to said thermally sensitive portion at spaced locations thereon, said first and second electrodes being electrically and thermally conductive, and being sufficiently thin so that they absorb infrared radiation; and including the step of fabricating circuitry within said infrared detector which is electrically coupled to said first and second electrodes, and which is capable of measuring said electrical characteristic of said thermally sensitive portion through said electrodes.

24. A method according to claim 23, including the step of configuring said infrared detector to have a substrate with said circuitry therein; and including the step of configuring each said detector element to include a membrane supported in spaced relation to said substrate and having therein said thermally sensitive portion and said first and second electrodes.

25. A method according to claim 23, including the step of configuring said thermally sensitive portion to include amorphous silicon.

26. A method according to claim 22, including the steps of:

fabricating first and second electrodes which are electrically coupled to said thermally sensitive portion at spaced locations thereon, said first and second electrodes being electrically conductive;

configuring said infrared detector to include circuitry which is electrically coupled to said first and second electrodes, said circuitry being capable of measuring said electrical characteristic of said thermally sensitive portion through said electrodes; and configuring said structure of each said detector element to include a layer which is made of said alloy, which is spaced from said electrodes, and which is sufficiently thin so that it absorbs infrared radiation.

27. A method according to claim 26, including the step of configuring said infrared detector to have a substrate with said circuitry therein; and configuring each said detector element to have a membrane which is supported in spaced relation to said substrate and which has therein said thermally sensitive portion, said layer, and said first and second electrodes.

28. A method according to claim 26, wherein said step of configuring said structure includes the step of configuring said layer to be a further electrode which is disposed on a side of said thermally sensitive portion opposite from said first and second electrodes.

29. A method according to claim 26, including the step of configuring said thermally sensitive portion to include amorphous silicon.

30. An apparatus, comprising an infrared detector with a plurality of detector elements that each include:

an amorphous silicon portion;

first and second insulating portions provided at spaced locations on said amorphous silicon portion; and first and second electrodes which are electrically coupled to said amorphous silicon portion at spaced locations thereon, a substantial portion of said first electrode being disposed on said first insulating portion, and a substantial portion of said second electrode being disposed on said second insulating portion.

31. An apparatus according to claim 30, wherein said first and second electrodes are made of a material which absorbs thermal energy, are in thermal communication with said amorphous silicon portion, and are sufficiently thin so that they are substantially absorbing to infrared radiation.

32. An apparatus according to claim 31, wherein said electrodes are made from an alloy which includes aluminum and titanium.

33. An apparatus according to claim 31, wherein said electrodes are made from an alloy which includes approximately equal amounts of aluminum and titanium.

34. An apparatus according to claim 30, wherein said infrared detector includes an integrated circuit, a membrane having therein said amorphous silicon portion, said insulating portions and said electrodes, and structure which supports said membrane at a location spaced above said integrated circuit and which electrically couples each of said first and second electrodes to said integrated circuit.

35. An apparatus according to claim 34, wherein said integrated circuit has thereon below said membrane a reflective surface which reflects infrared radiation; and wherein a distance between said reflective surface and said membrane is selected as a function of infrared wavelengths of interest, so that a region between said membrane and said reflective surface will serve as a resonant cavity for said wavelengths of interest.

36. An apparatus according to claim 30, wherein said first and second electrodes have interdigitated fingers.

37. A method of making an infrared detector having a plurality of detector elements, comprising the steps of:

providing an amorphous silicon portion which has a selected temperature coefficient of resistance;

fabricating first and second insulating portions at spaced locations on said amorphous silicon portion; and fabricating first and second electrodes which are at spaced locations on said amorphous silicon portion and which are electrically coupled to said amorphous silicon portion, including the step of structurally configuring said electrodes so that a substantial portion of said first electrode is disposed on said first insulating portion, and a substantial portion of said second electrode is disposed on said second insulating portion.

38. A method according to claim 37, wherein said step of fabricating said electrodes includes the steps of forming said electrodes from a material which absorbs thermal energy and which is in thermal communication with said amorphous silicon portion, and forming said electrodes to be sufficiently thin so that they are substantially absorbing to infrared radiation.

* * * * *